United States Patent [19]

Keur et al.

[11] Patent Number: 4,948,779
[45] Date of Patent: Aug. 14, 1990

[54] SUPERCONDUCTIVE THIN LAYER

[75] Inventors: Wilhelmus C. Keur; Cornelis A. H. A. Mutsaers; Henricus A. M. Van Hal, all of Eindhoven, Netherlands

[73] Assignee: U.S. Philips Corporation, New York, N.Y.

[21] Appl. No.: 224,109

[22] Filed: Jul. 26, 1988

[30] Foreign Application Priority Data

Jul. 28, 1987 [NL] Netherlands ........................... 8701779

[51] Int. Cl.$^5$ ................................................. B32B 9/00
[52] U.S. Cl. ........................................ 505/1; 505/701; 505/702; 505/703; 505/704; 505/724; 29/599; 428/209; 428/432; 428/688; 428/693; 428/697; 428/901; 428/930

[58] Field of Search ............................ 505/1, 701–704, 505/724; 29/599; 428/209, 432, 688, 693, 697, 901, 930

[56] References Cited

PUBLICATIONS

Superconductivity of Screen-Printed Y-Ba$_2$Cu$_3$O$_y$ Thick Films on Y$_2$BaCuO$_5$ Subs, Yoshiara et al., Japanese Journ. Appl. Phys., vol. 27, No. 8, 8-88, pp. L1492–L1494, 7/88.

Primary Examiner—Patrick Ryan
Attorney, Agent, or Firm—Norman N. Spain

[57] ABSTRACT

Superconductive thin layer of YBa$_2$Cu$_3$O$_{7-\delta}$ in which reactions with the substrate are prevented in that at least the surface of the substrate consists of a compound having such a composition that in the Y$_2$O$_3$-BaO-CuO phase diagram it is situated on a segregation line with YBa$_2$Cu$_3$O$_{7-\delta}$ as shown in FIG. 1.

2 Claims, 2 Drawing Sheets

SUPERCONDUCTIVE THIN LAYER

BACKGROUND OF THE INVENTION

The invention relates to a superconductive thin layer of $YBa_2Cu_3O_{7-\delta}$.

This material, in which $\delta = 0.1-0.5$, is superconductive at temperatures lower than approximately 90 K.

Such a superconductive thin layer is described, for example, in "Thin superconducting oxide films" by R. B. Laibowitz a.o., Physical Review B, 35 (16), pp. 8821–8823 (1987). Sapphire (aluminum oxide) or magnesium oxide is used as a substrate. The thin layer is manufactured by means of electron beam evaporation in a vacuum.

The manufacture of superconductive thin layers on aluminum oxide is also described in "Superconducting thin films of the perovskite superconductors by electronbeam deposition" by R. H. Hammond a.o., Extended Abstracts for MRS Symposium on High Temperature Superconductors, Anaheim, Apr. 23–24 (1987). In order to suppress diffusion between the substrate and the superconducting thin layer, buffer layers are used, for example, consisting of $MgO$, $Ta_2O_5$, $LaF_3$ or $ZrO_2$.

Other substrate materials which are used for providing superconductive thin layers of $YBa_2Cu_3O_{7-\delta}$ are strontium titanate and noble metals, for example gold and silver.

After the deposition of the superconductive thin layer this layer must still be subjected to a prolonged treatment at high temperature in oxidizing conditions. The problem then occurs that the superconductive compound in many cases reacts with the substrate which is at the expense of the superconductive properties. The transition temperature $T_c$ to superconductive behaviour becomes lower and the transition becomes less steep. The incorporation in particular of metals, for example, aluminum and silicon has proved detrimental. Noble metals and strontium titanate are more suitable, but strontium titanate may also react with $YBa_2Cu_3O_{7-\delta}$.

SUMMARY OF THE INVENTION

It is the object of the invention to provide a substrate material in which the problem of a reaction with the superconductive thin layer does not occur.

According to the invention, this object is achieved in that the thin layer is provided on a substrate of which at least the surface consists of a compound having such a composition that in the $Y_2O_3$-$BaO$-$CuO$ phase diagram of FIG. 1 it is situated on a segregation line connecting $YBa_2Cu_3O_{7-\delta}$.

DETAILED DESCRIPTION OF THE INVENTION

As examples of compounds that are present on the tie being there may be considered $CuO$, $BaCuO_2$ and $Y_2BaCuO_5$.

EXAMPLE

A layer of $YBa_2Cu_3O_{7-\delta}$ is provided by means of plasma sputtering on a substrate of $Y_2BaCuO_5$. Alternative modes of preparation for the thin layer are, for example, electron beam deposition, laser deposition and sputtering. The layer is kept at a temperature of 900° C. for 24 hours and is then cooled slowly (in 8 hours to 20° C.) in oxidizing conditions, according to the example in oxygen. This after-treatment is necessary to obtain a good oxygen contents in the superconductive material, with $\delta \approx 0.3$. This, as well as the valency of the copper atoms, is of importance for obtaining a good result. The detrimental effects of the presence of metals, for example, aluminium and silicon, may possibly be explained by a disturbance of the quantity of oxygen and of the copper valency.

Figure 1:
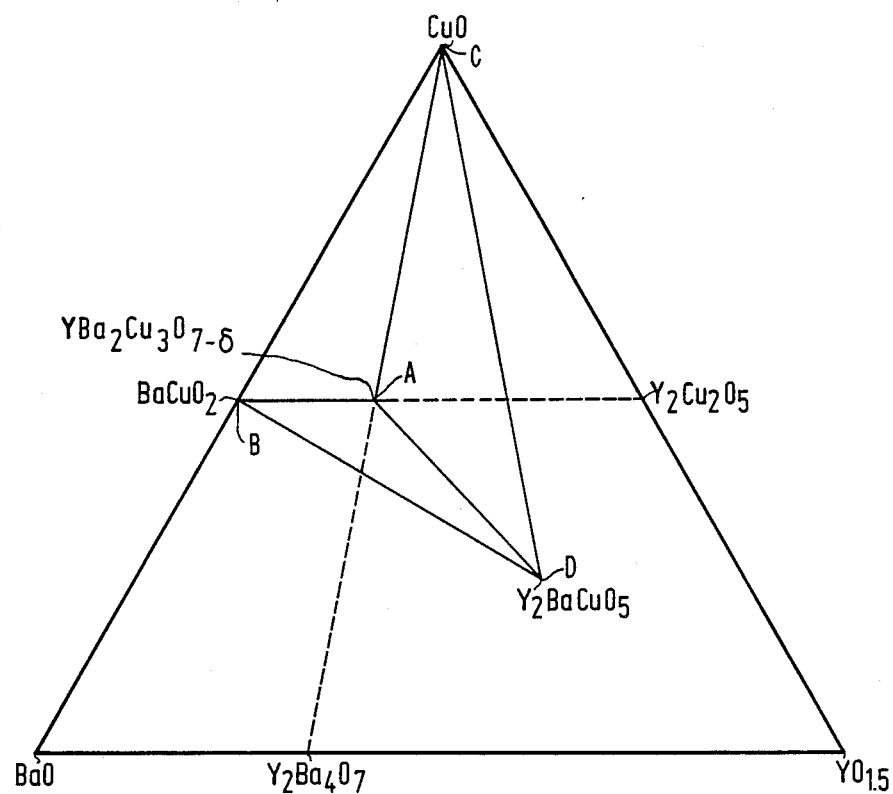
FIG. 1 shows the $Y_2O_3$-$B_aO$-$CuO$ phase diagram.

FIG. 1 shows the $Y_2O_3$-$BaO$-$CuO$ phase diagram, in which both $YBa_2Cu_3O_{7-\delta}$ and $Y_2BaCuO_5$ are show, which compounds are present on a segregation line in the phase diagram.

Figure 2:
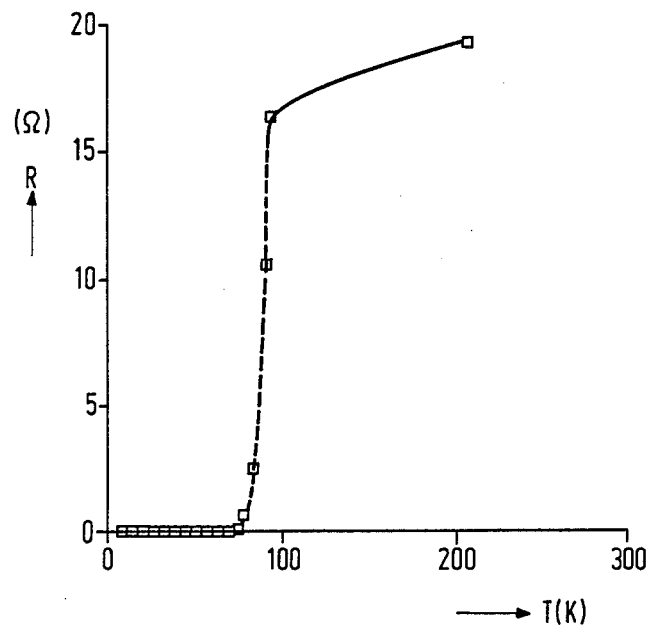
FIG. 2 is a graph showing the resistance as a function of temperature of a thin layer supported by a substrate according to the invention.

FIG. 2 shows the results of a measurement of the electric resistance as a function of the temperature of a layer according to the invention of $YBa_2Cu_3O_{7-\delta}$ on a substrate of $Y_2BaCuO_5$. The transition, at approximately 90 K, is particularly steep.

Figure 3:
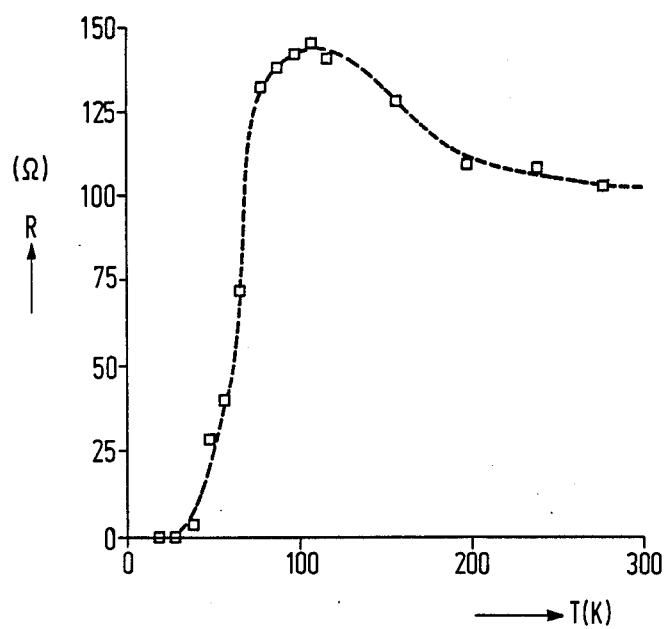
FIG. 3 is a graph showing resistance of a similar thin layer supported by a substrate of aluminum oxide, not according to the invention.

For comparison FIG. 3 shows the result of a measurement of the resistance as a function of the temperature of a layer of $YBa_2Cu_3O_{7-\delta}$ on a substrate of sapphire, not according to the invention. The transition lies at a lower temperature and is much wider so that a resistance R=0 is reached only at a temperature lower than 40 K.

What is claimed is:

1. A superconductive thin layer of $YBa_2Cu_3O_{7-\gamma}$ wherein $\gamma = 0.1-0.5$ supported by a substrate, at least the surface of said substrate in contact with said superconductive thin layer consisting of a compound having a composition falling on one of the tie lines connecting $YBa_2Cu_3O_{7-\gamma}(A)$, $BaCuO_2(B)$, $CuO$-(C) and $Y_2B_aCuO_5(D)$ in the $Y_2O_3$-$BaO$, $Cu\ O$ phase diagram shown in the accompanying FIG. 1.

2. The superconductive thin layer supported by the substrate of claim 1 wherein the surface of the substrate in contact with the superconductive thin layer consists of $Y_2BaCuO_5$.

* * * * *